(12) United States Patent
Cranford et al.

(10) Patent No.: US 8,363,736 B2
(45) Date of Patent: Jan. 29, 2013

(54) TEST CIRCUIT FOR SERIAL LINK RECEIVER

(75) Inventors: Hayden C. Cranford, Cary, NC (US); Daniel P. Greenberg, Raleigh, NC (US); Joseph M. Stevens, Morrisville, NC (US); Westerfield J. Ficken, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/044,604

(22) Filed: Mar. 10, 2011

(65) Prior Publication Data
US 2011/0156663 A1 Jun. 30, 2011

Related U.S. Application Data

(62) Division of application No. 11/621,016, filed on Jan. 8, 2007, now Pat. No. 7,940,846.

(51) Int. Cl.
*H04L 25/00* (2006.01)
*H04B 17/00* (2006.01)

(52) U.S. Cl. .................................... 375/257; 375/224

(58) Field of Classification Search ................. 375/257, 375/222, 224; 257/40, 72; 365/185.16; 327/333; 330/261, 258
See application file for complete search history.

(56) References Cited

U.S. PATENT DOCUMENTS

| | | | |
|---|---|---|---|
| 5,663,689 A | 9/1997 | Baumgartner et al. | |
| 5,767,698 A | 6/1998 | Emeigh et al. | |
| 5,973,631 A | 10/1999 | McMullen et al. | |
| 6,064,242 A | 5/2000 | Yoshiba | |
| 6,078,978 A | 6/2000 | Suh | |
| 6,198,320 B1 | 3/2001 | Boerstler | |
| 6,218,901 B1 | 4/2001 | Lukes et al. | |
| 6,366,125 B1 | 4/2002 | Rochard | |
| 6,563,352 B1 | 5/2003 | Gohel et al. | |
| 6,804,305 B1 | 10/2004 | Chan | |
| 2006/0220705 A1 | 10/2006 | Shau | |
| 2007/0146249 A1* | 6/2007 | Kimura | 345/76 |
| 2010/0090203 A1* | 4/2010 | Obata et al. | 257/40 |

OTHER PUBLICATIONS

P. Mollier et al., "Inter-chip noise reduction schematic for referenced receivers," IBM Technical Disclosure bulletin FR886-0157, vol. 31, No. 2, Jul. 1988.

* cited by examiner

*Primary Examiner* — Khai Tran
(74) *Attorney, Agent, or Firm* — Ian MacKinnon

(57) ABSTRACT

A test circuit for a serial link receiver includes a first current source coupled to a first input of the serial link receiver, and a second current source coupled to a second input of the serial link receiver. The first current source is symmetrically matched to the second current source. A first switch of the first current source is turned on to permit a charge-retaining mechanism thereof to be charged. A second switch of the first current source is turned on to permit the retained charge retained to be asserted on the first input. The charge turns on a control switch of the first current source, through which the charge is asserted on the first input. A charge-draining mechanism of the first current source is turned on to thereafter permit the charge to be drained in a controlled manner after the charge has been asserted.

4 Claims, 5 Drawing Sheets

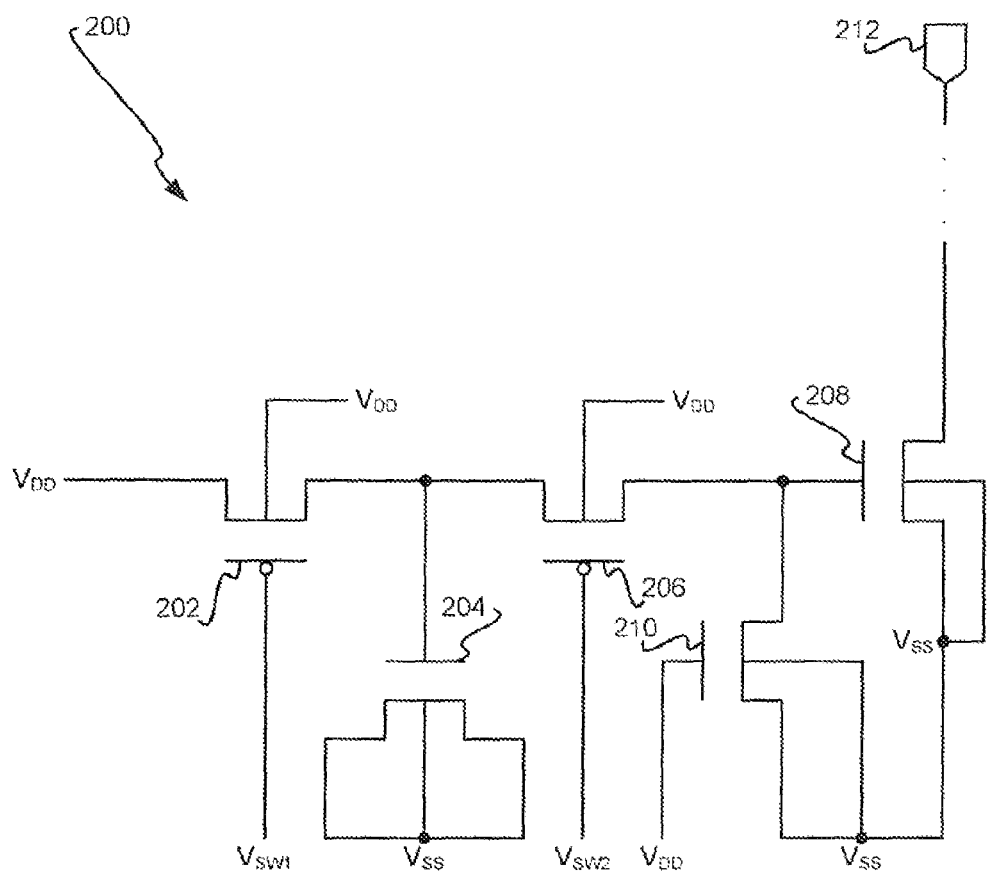

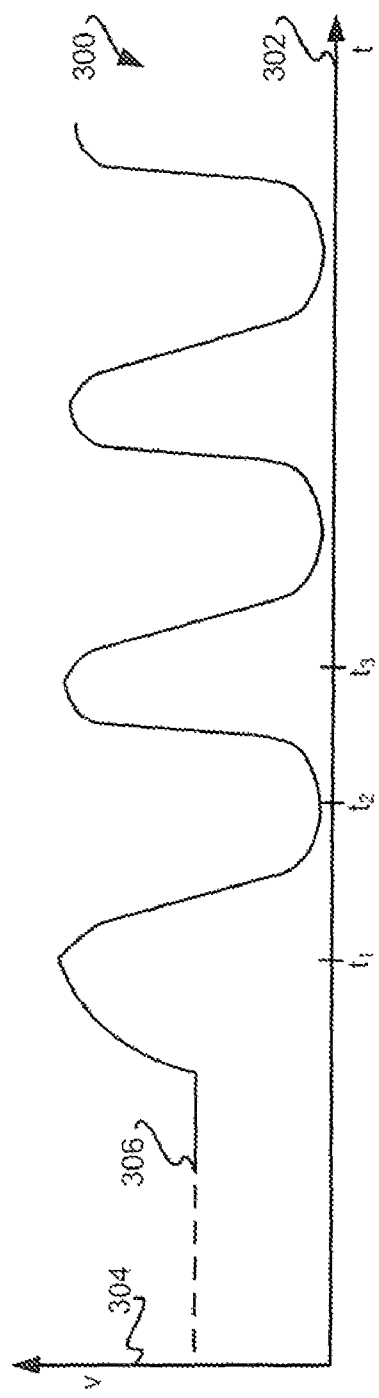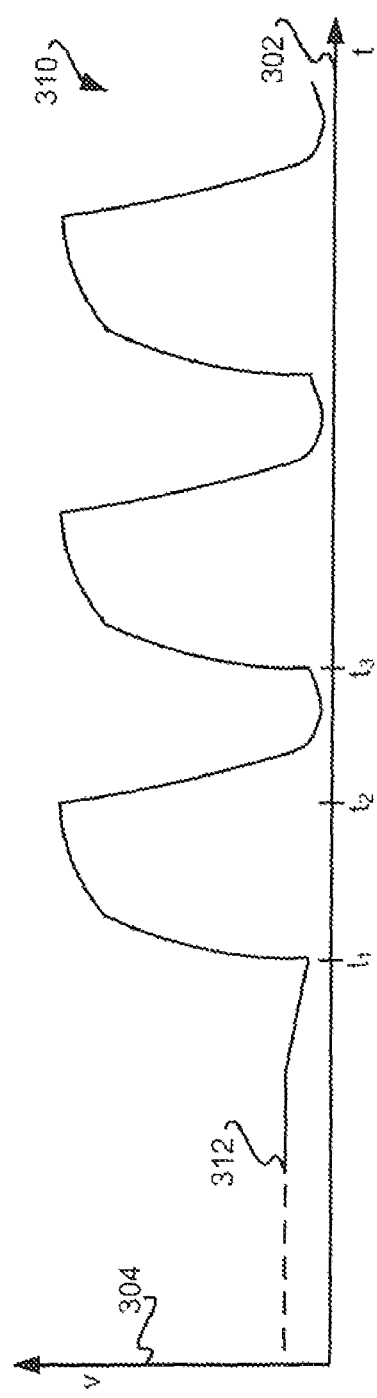

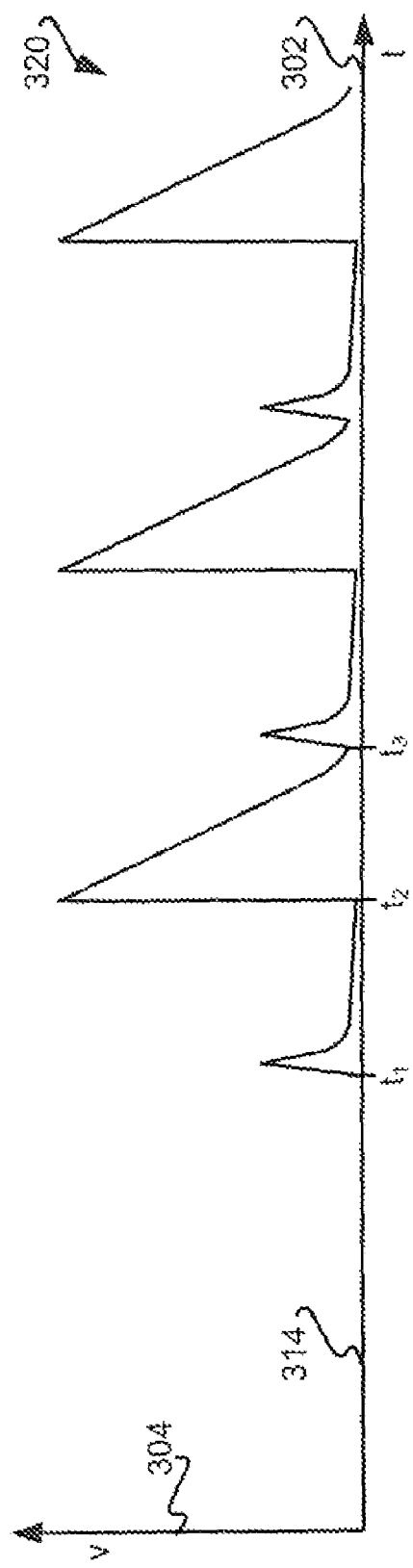

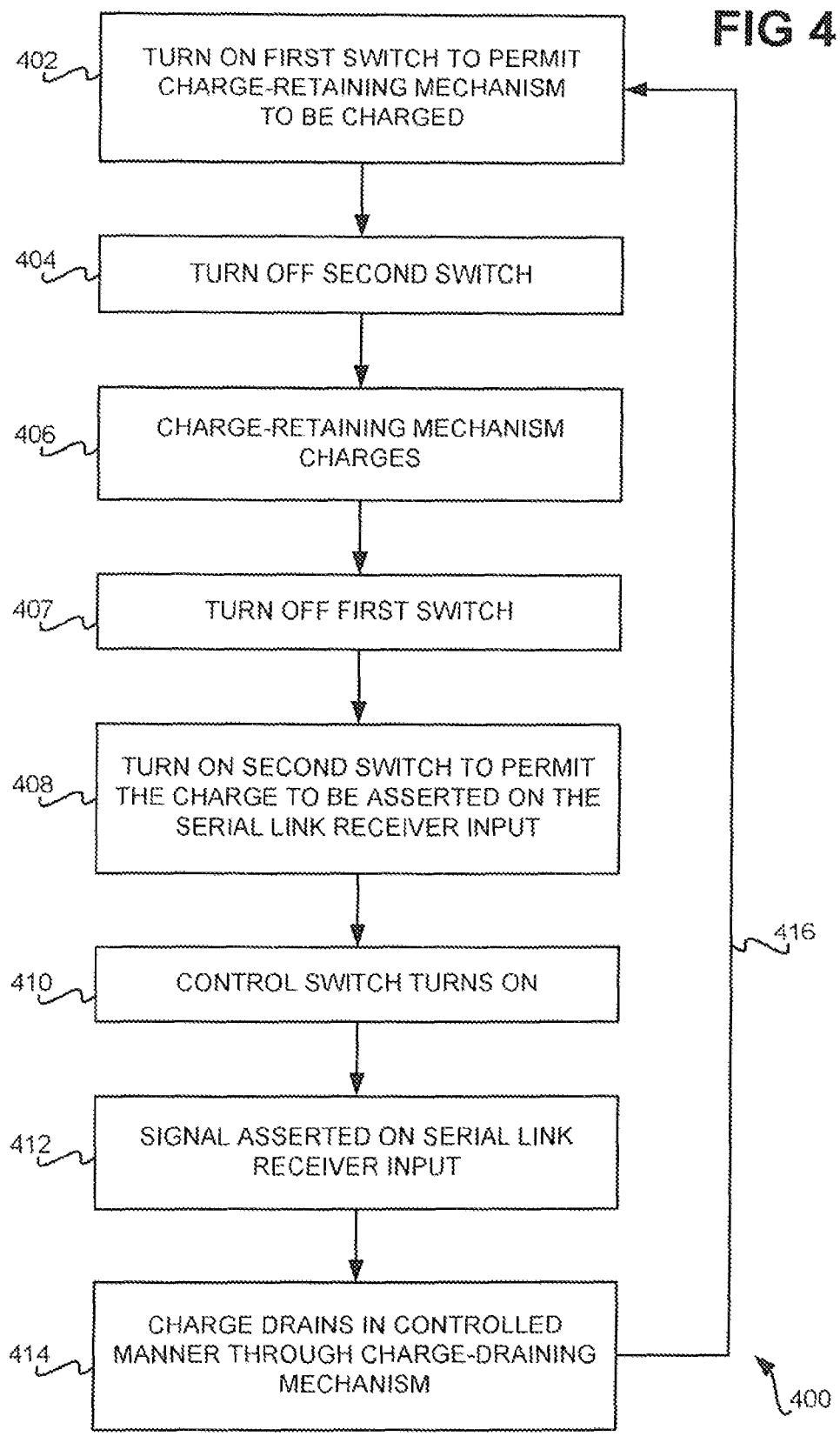

TEST CIRCUIT FOR SERIAL LINK RECEIVER

RELATED APPLICATIONS

The present patent application is a divisional of the previously filed and presently pending patent application of the same title, filed on Feb. 7, 2007, and assigned Ser. No. 11/621,016.

FIELD OF THE INVENTION

The present invention relates generally to serial link receivers, such as wide common mode serial link receivers, and more particularly to test circuits, such as integrated test circuits, for such serial link receivers.

BACKGROUND OF THE INVENTION

The electronics industry is currently shifting away from traditional parallel communication methodologies towards new, high-speed serial communication technologies. For instance, traditional parallel-based peripheral component interface (PCI) technologies are being supplanted by serial-based PCI Express technologies, which provide for faster communications. Similarly, parallel ATA (PATA) technologies employed for storage devices are being supplanted by serial ATA (SATA) technologies, which provide for faster communications.

A serial link is thus a link that allows a component, such as a peripheral or a storage device, to communicate serially with another component or a host computing device, where the host computing device has a corresponding serial link. A serial link includes a serial link transmitter to transmit data. A serial link also includes a serial link receiver to receive data.

An important aspect in developing a reliable serial link is to test its serial link receiver. Particularly, the serial link receiver has to be tested to ensure that it is capable of receiving data at the rated bandwidth of the serial link, among other constraints. Two conventional approaches to serial link receiver testing include employing an inverter and employing a multiplexer.

Employing an inverter to test a serial link receiver includes placing the inverter on an input of the serial link receiver to generate a test signal. However, this inverter-based approach is less than ideal, because it limits the termination voltage on the input to the pre-designed maximum termination voltage of the serial link receiver. As a result, a given serial link receiver cannot be tested past its already established tolerances.

Employing a multiplexer to test a serial link receiver includes placing an output of a multiplexer at some point of the data path within the serial link receiver associated with an input of the serial link receiver to generate a test signal. However, this multiplexer-based approach is also less than ideal, because multiplexers generally cannot be switched at the high bandwidths of serial link receivers. Furthermore, there can be limitations associated with positioning a multiplexer on a given serial link receiver.

For these and other reasons, therefore, there is a need for the present invention.

SUMMARY OF THE INVENTION

The present invention relates to a test circuit for a serial link receiver. A test circuit for a serial link receiver of one embodiment of the invention includes a first current source and a second current source. The first current source is coupled to a first input of the serial link receiver. The second current source is coupled to a second input of the serial link receiver. The first current source is symmetrically matched to the second current source. The current sources are appropriately switched on and off to test the serial link receiver.

A serial link receiver of an embodiment of the invention includes a first input, a second input complementary to the first input, and an integrated test circuit. The integrated test circuit includes a first current source coupled to the first input and a second current source coupled to the second input. The first current source is symmetrically matched to the second current source. The current sources are appropriately switched on and off to test the serial link receiver.

A method of one embodiment of the invention charges a charge-retaining mechanism of a current source of a test circuit for a serial link receiver. A signal is asserted on an input of the serial link receiver using the charge retained by the charge-retaining mechanism. The charge is then drained in controlled manner after that the charge has been asserted on the input of the serial link receiver.

For instance, a first switch of the current source of the test circuit may be turned on to permit the charge-retaining mechanism to be charged. A second switch of the current source of the test circuit may be turned off while the charge-retaining mechanism is being charged. The second switch is then turned on to permit the charge retained by the charge-retaining mechanism to be asserted on the input of the serial link receiver. The first switch is turned off while the charge retained by the charge-retaining mechanism is being asserted on the input. The charge turns on a control switch of the current source of the test circuit through which the charge is asserted on the input of the serial link receiver. Thereafter, a charge-draining mechanism of the current source of the test circuit is turned on to permit the charge to be drained in the controlled manner.

Embodiments of the invention provide for advantages over the prior art. Unlike multiplexer-based serial link receiver testing, for instance, the current source-based serial link receiver testing of embodiments of the invention does not suffer from bandwidth limitations. Furthermore, unlike inverter-based serial link receiver testing, the current source-based serial link receiver testing of embodiments of the invention permits a serial link receiver to be tested past its established termination voltage tolerances. Still other advantages, aspects, and embodiments of the invention will become apparent by reading the detailed description that follows, and by referring to the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIG. 2 is a schematic diagram of an integrated test circuit of a serial link receiver in detail, according to an embodiment of the invention.

FIGS. 3A, 3B, and 3C are timing diagrams of the signals associated with an integrated test circuit of a serial link receiver, according to an embodiment of the invention.

FIG. 4 is a flowchart of a method for testing a serial link receiver using a current source-based test circuit, according to an embodiment of the invention.

DETAILED DESCRIPTION OF THE DRAWINGS

Figure 1:
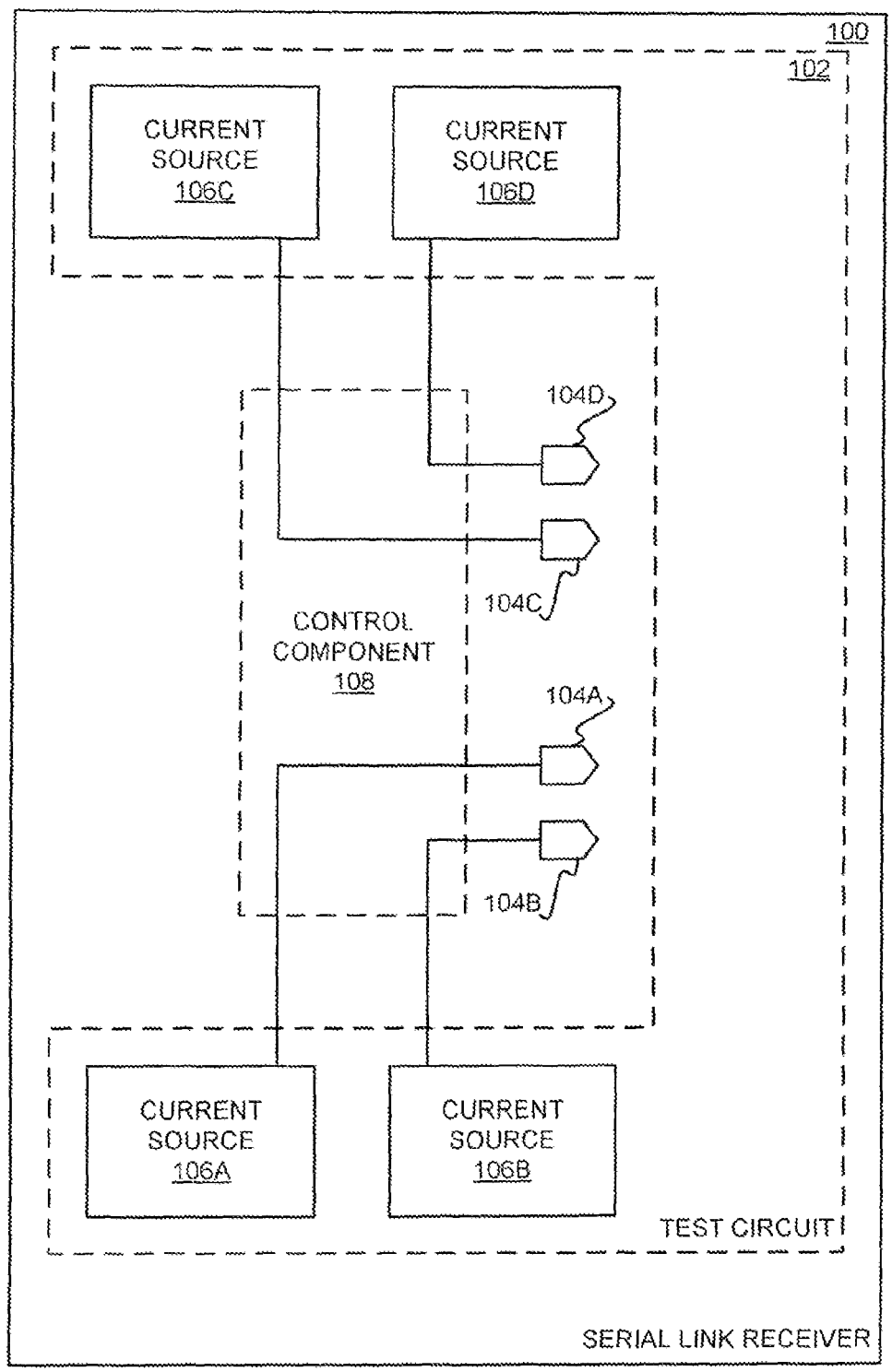
FIG. 1 is a diagram of a serial link receiver having an integrated test circuit, according to an embodiment of the invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

FIG. 1 shows a block diagram of a serial link receiver 100, according to an embodiment of the invention. The serial link receiver 100 may be part of a serial link component or device that also includes a serial link transmitter. The serial link receiver 100 provides for high-speed reception of data in a serial manner. The serial link receiver 100 is depicted in FIG. 1 as include an integrated test circuit 102, a number of inputs 104A, 104B, 104C, and 104D, collectively referred to as the inputs 104, and a control component 108. As can be appreciated by those of ordinary skill within the art, the serial link receiver 100 can and typically does include other components, in addition to and/or in lieu of those depicted in FIG. 1.

The test circuit 102 is integrated within the link receiver 100 in one embodiment in that it can be fabricated on the same integrated circuit (IC) as the receiver 100. The test circuit 102 is depicted as including a number of current sources 106A, 106B, 106C, and 106D, collectively referred to as the current sources 106. The test circuit 102 can include other components, in addition to the current sources 106. The current sources 106 are communicatively coupled to the inputs 104 of the link receiver 100 through a control component 108. The control component 108 provides for control switching of the inputs 104 to the current sources 106, as well as other types of control functionality, as can be appreciated by those of ordinary skill within the art. The control component 108, however, is not part of any embodiment of the invention.

The current sources 106A and 106B are symmetrically matched to one another, such that when the current source 106A is asserted on the input 104A, pulling the input 104A down to a low voltage, the current source 106B is not asserted on the input 104B, and vice-versa. As such, the input 104A is complementary to the input 104B, and vice-versa, such that when the input 104A is high, the input 104B is low, and vice-versa. Likewise, the current sources 106C and 106D are symmetrically matched to one another. When the current source 106C is asserted on the input 104C, pulling the input 104C up to a high voltage, the current source 106D is not asserted on the input 104D, and vice-versa. The input 104C is thus complementary to the input 104D, and vice-versa, such that when the input 104C is high, the input 104D is low, and vice-versa.

There may be more or less of the inputs 104 and the current sources 106 in number. Generally, however, there is one current source per input. Furthermore, for each current source there is a symmetrically matched current source, and for each input there is a complementary input. The current sources 106A and 106B may be implemented from n-type transistors, as will be described, so that the inputs 104A and 104B can be pulled down to a low voltage. By comparison, the current sources 106C and 106D my be implemented from p-type transistors, as will be described, so that the inputs 104C and 104D can be pulled up to a high voltage.

The utilization of the current sources 106 within the test circuit 102 permits testing of the serial link receiver 100 within which the test circuit 102 is integrated at voltages greater than those that the serial link receiver 100 can otherwise nominally provide. This is because the current sources 106 have their own power sources to provide current, apart from the power sources provided to the serial link receiver 100 itself, in one embodiment of the invention. Furthermore, the current sources 106 can be switched on and off at high rates, which is advantageous to testing the high-bandwidth capability of the serial link receiver 100.

In one embodiment, the current sources 106A and 106B are independently operable. In another embodiment, the current sources 106A and 106B are dependently operable, such that when the current source 106A is pulling down its input 104A, the current source 106B is not pulling down its input 104B, and vice-versa. For instance, there may be a feedback loop between the current sources 106A and 106B to achieve such dependent operation, as can be appreciated by those of ordinary skill within the art. Likewise, the current sources 106C and 106D may be independently or dependently operable.

FIG. 2 shows a represent current source 200, according to an embodiment of the invention. The current source 200 includes two switches 202 and 206, a charge-retaining mechanism 204, a control switch 208, and a charge-draining mechanism 210. In one embodiment, the switches 202 and 206 are implemented as n-type transistors. In one embodiment, the charge-retaining mechanism 204, the control switch 208, and the charge-draining mechanism 210 are implemented as p-type transistors.

The current source 200 as depicted in FIG. 2 specifically exemplifies each of the current sources 106A and 106B, in that the current source 200 of FIG. 2 is capable of pulling its corresponding serial link receiver input 212 down to a voltage. However, the n-type transistors of the switches 202 and 206 can be replaced by p-type transistors, and the p-type transistors of the switch 208 and of the mechanisms 204 and 210 can be replaced by n-type transistors. In that case, the current source 200 instead exemplifies each of the current sources 106C and 106D, such that it is capable of pulling its corresponding serial link receiver input 212 up to a voltage.

The switches 202 and 206 control whether the charge-retaining mechanism 204 is charged or is being discharged. Where the voltage $V_{SW1}$ is low and the voltage $V_{SW2}$ is high, the switch 202 is on and the switch 206 is off. As a result, current via the voltage $V_{DD}$ flows through the switch 202 and turns on the gate of the transistor of the charge-retaining mechanism 204. The transistor of the charge-retaining mechanism 204 is implemented to operate in a capacitive mode of operation, where its gate, source, and body are all tied to the same voltage, referred to as $V_{SS}$. The bodies of the transistors of the switches 202 and 206 are tied to the voltage $V_{DD}$. The source of the transistor of the switch 202 is tied to the voltage $V_{DD}$, whereas the drain of the transistor of the switch 202 is connected to the source of the transistor of the switch 206.

Where the voltage $V_{SW1}$ is high and the voltage $V_{SW2}$ is low, the switch 202 is off and the switch 202 is on. As a result, the charge stored, or retained, within the charge-retaining mechanism 204 flows as current through the switch 206, turning on the control switch 208 due to the gate of the transistor of the control switch 208 being connected to the source of the drain of the switch 206. The body of the transistor of the control switch 208 is tied to the drain of the transistor of the control switch 208, and thus the body and the drain are at the same voltage $V_{SS}$. The serial link receiver input 212, connected to the source of the transistor of the control switch 208, is thus pulled down to the voltage $V_{SS}$.

Furthermore, the charge-draining mechanism 210 permits the charge to be drained in a controlled manner. That is, the charge-draining mechanism 210 has a resistive-capacitive (RC) time constant, as can be appreciated by those of ordinary skill within the art, which controls how the charge stored on the charge-retaining mechanism 204 is drained via the serial link receiver input 212. The gate of the transistor of the charge-draining mechanism 210 is tied to the voltage $V_{DD}$, whereas the source of this transistor is connected to the source of the transistor of the switch 206. The body of the transistor of the charge-draining mechanism 210 is connected to this transistor's drain, such that both are at the same voltage $V_{SS}$.

Therefore, the basic operation of the current source 200 is that, within each clock cycle, the switch 202 is turned on and the switch 206 is turned off to permit the charge-retaining mechanism 204 to become charged. The switch 202 is then turned off and the switch 206 is turned on. The charge stored on the charge-retaining mechanism 204 is thus asserted on the serial link receiver input 212 via the control switch 208, which is turned on as a result of current flowing from the charge-retaining mechanism 204 through the switch 206 to the gate of the control switch 208. The input 212 is therefore pulled down to the voltage $V_{SS}$.

FIGS. 3A, 3B, and 3C show various diagrams of the current source 200 of FIG. 2 where the current source 200 is implementing one of the current sources 106C and 106D of FIG. 1, according to an embodiment of the invention. The graph 300 of FIG. 3A denotes the response 306 at the serial link receiver input 212. The graph 310 of FIG. 3B denotes the response 312 at the charge-retaining mechanism 204. The graph 320 of FIG. 3C denotes the response 314 at the switch 206. The x-axis 302 denotes time, and the y-axis denotes voltage.

The responses 306, 312, and 314 are described in relation to one complete time cycle, between time $t_1$ to time $t_3$. At time $t_1$, the switch 206 is off; the response 314 indicates a minor transient noise spike. At this time, the switch 202 is on, such that the charge-retaining mechanism 204 is charging between time $t_1$ and time $t_2$, as indicated by the response 312. The response 306 at the serial link receiver input 212 is falling between time $t_1$ and time $t_2$, since it does not have a signal being applied to it such that the input 212 is floating.

At time $t_2$, the switch 206 is turned on, as indicated by the response 314. Likewise, the switch 202 is turned off. The charge at the charge-retaining mechanism 204 is asserted at the serial link receiver input 212, such that the input 212 has its voltage pulled up between time $t_2$ and time $t_3$ due to the control switch 208 turning on. The charge at the charge-retaining mechanism 204 is drained through the charge-draining mechanism 210, such that the voltage level at the mechanism 204 decays between time $t_2$ and time $t_3$. At time $t_3$, the switch 206 is again turned off, which results in the control switch 208 turning off, and the switch 202 is again turned on, such that this process is repeated.

FIG. 4 shows a method 400 for using the current source 200 in relation to the serial link receiver input 212, according to an embodiment of the invention. The current source 200 is used to test the input 212. That is, the current source 200 exercises the input 212 at a desired voltage level and/or at a desired frequency. The serial link receiver can then be monitored during this process to ensure that it is performing appropriately and as desired.

The (first) switch 202 is turned on (402) to permit the charge-retaining mechanism 204 to be charged. While this occurs, the (second) switch 206 is turned off (404). The charge-retaining mechanism 204 is thus charged (406). Thereafter, the switch 202 is turned off (407), and the switch 206 is turned on (408), to permit the charge retained by the charge-retaining mechanism 204 to be asserted on the serial link receiver input 212. First, the control switch 208 turns on (410) due to this charge, such that a signal is asserted on the serial link receiver input 212 (412) the control switch 208. The charge during this time drains in a controlled manner due to the charge-draining mechanism 210 (414). The method 400 is then repeated (416).

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. Therefore, it is manifestly intended that this invention be limited only by the claims and equivalents thereof.

We claim:

1. A method comprising:
charging a charge-retaining mechanism of a current source of a test circuit for a serial link receiver;
asserting a signal on an input of the serial link receiver using charge retained by the charge-retaining mechanism; and,
draining the charge in a controlled manner after the charge has been asserted on the input of the serial link receiver.

2. The method of claim 1, further comprising:
turning on a first switch of the current source of the test circuit to permit the charge-retaining mechanism to be charged; and,
turning off a second switch of the current source of the test circuit while the charge-retaining mechanism is being charged.

3. The method of claim 2, further comprising:
turning on the second switch to permit the charge retained by the charge-retaining mechanism to be asserted on the input of the serial link receiver;
turning off the first switch while the charge retained by the charge-retaining mechanism is being asserted on the input of the serial link receiver; and,
the charge turning on a control switch of the current source of the test circuit through which the charge is asserted on the input of the serial link receiver.

4. The method of claim 3, further comprising:
turning on a charge-draining mechanism of the current source of the test circuit to permit the charge to be drained in a controlled manner after the charge has been asserted on the input of the serial link receiver.

* * * * *